US009503252B2

United States Patent
Huang et al.

(10) Patent No.: US 9,503,252 B2
(45) Date of Patent: Nov. 22, 2016

(54) PHASE INTERPOLATOR WITH LINEAR PHASE CHANGE

(71) Applicant: Taiwan Semiconductor Manufacturing Co., Ltd., Hsin-Chu (TW)

(72) Inventors: Ming-Chieh Huang, San Jose, CA (US); Chan-Hong Chern, Palo Alto, CA (US); Tao Wen (David) Chung, San Jose, CA (US); Tsung-Ching (Jim) Huang, San Jose, CA (US); Chih-Chang Lin, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 61 days.

(21) Appl. No.: 14/164,399

(22) Filed: Jan. 27, 2014

(65) Prior Publication Data

US 2014/0270031 A1 Sep. 18, 2014

Related U.S. Application Data

(60) Provisional application No. 61/781,246, filed on Mar. 14, 2013.

(51) Int. Cl.
*H04L 7/00* (2006.01)
*H03L 7/081* (2006.01)

(52) U.S. Cl.
CPC ........... *H04L 7/0025* (2013.01); *H03L 7/0812* (2013.01)

(58) Field of Classification Search
CPC . H04L 25/028; H04L 7/0012; H04L 7/0016; H04L 7/0025
USPC ........................................................ 375/371
See application file for complete search history.

(56) References Cited

U.S. PATENT DOCUMENTS

| 2005/0028019 | A1* | 2/2005 | Kim | .......................... | G11C 7/22 |
| | | | | | 713/500 |
| 2009/0231009 | A1* | 9/2009 | Momtaz | ................. | H03H 11/02 |
| | | | | | 327/237 |
| 2011/0243289 | A1* | 10/2011 | Seol | .......................... | G11C 7/22 |
| | | | | | 375/371 |

OTHER PUBLICATIONS

Yang, Chih-Kong Ken. "Delay-Locked Loops: An Overview." Phase-Locking in High-Performance Systems, IEEE Press. Published in 2003. 10 Pages.

* cited by examiner

*Primary Examiner* — David S Huang
(74) *Attorney, Agent, or Firm* — Escheiler & Associates, LLC

(57) ABSTRACT

Some embodiments relate to a phase interpolator. The phase interpolator includes a control block to provide a plurality of phase interpolation control signals which are collectively indicative of a phase difference between a first clock and a second clock. The phase interpolation control signals define different phase step sizes by which the first clock is to be phase shifted to limit the phase difference. A plurality of Gilbert cells provide a plurality of current levels, respectively, based on the plurality of phase interpolation control signals. A plurality of current control elements adjust the plurality of current levels from the plurality of Gilbert cells. The plurality of current levels are adjusted by different amounts for the different phase step sizes.

20 Claims, 4 Drawing Sheets

PHASE INTERPOLATOR WITH LINEAR PHASE CHANGE

BACKGROUND

Modern integrated circuits (ICs) are made up of millions or even billions of transistors, where each transistor can switch on and off more than a billion of times per second. These logical operations, which are densely packed both physically and temporally, are what provide modern ICs with sufficient processing power to carry out complex algorithms required in modern communication systems, vehicular systems, industrial systems, and the like.

Although modern manufacturing processes allow engineers to build circuits with these feature densities, the feature densities in combination with the fast operating frequencies can lead to challenges. One such challenge is clock skew, which is sometimes called timing skew. Clock skew is a phenomenon in synchronous circuits where a clock signal (sent from a clock circuit) arrives at different gates at different times. This can be caused by many different things, such as wire-interconnect length, temperature variations, variation in intermediate devices, capacitive coupling, material imperfections, and differences in input capacitance on the clock inputs of devices using the clock. As the clock rate of a circuit increases, timing becomes more critical, and less variation can be tolerated if the circuit is to function properly.

Thus, clock skew introduces a phase shift or phase difference in the arrival time between two sequentially-adjacent registers. It is desirable to limit clock skew to help ensure logical operations are performed accurately on chip.

DETAILED DESCRIPTION

Figure 1:
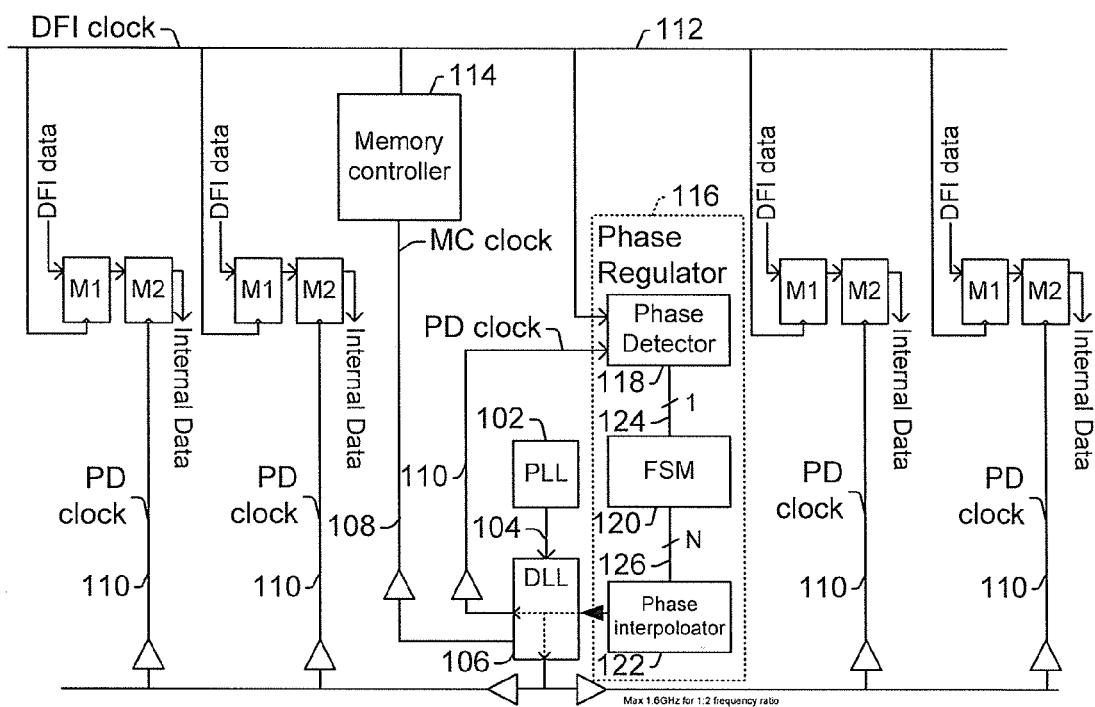
FIG. 1 shows a block diagram of a digital system which includes multiple clock domains and a phase regulator to limit undesired phase differences between the clock domains.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 shows a system 100 for phase regulation of one or more clock signals, wherein the phase regulation is used to limit clock skew between different clock domains. The system includes first memory elements M1 arranged in a first clock domain, and second memory elements M2 arranged in a second clock domain. The illustrated system 100 shows each of the second memory elements M2 being directly sequentially adjacent to a corresponding first memory element M1, however, in other embodiments additional memory elements can be present between M1 and M2.

To clock the memory elements M1, M2; a phase locked loop 102 provides a PLL clock signal 104 to a delay locked loop (DLL) 106. The DLL 106 in turn, provides a memory controller clock 108 and a phase delayed clock 110, both of which are based on the PLL clock 104. The first memory elements M1 are clocked by a DFI clock 112, which is provided by memory controller 114 and based on the MC clock 108, while the second memory elements M2 are clocked by the PD clock 110. Because of the different delay paths traversed by the clock signals, the DFI clock 112 and PD clock 110 can exhibit a phase offset or phase shift relative to one another. This phase offset can lead to problems when data from the first memory elements M1 are latched at the second memory elements M2.

To limit phase offset between the clock signals, a phase regulator 116 is included. The phase regulator 116 includes a phase detector 118, finite state machine 120, and a phase interpolator 122. During operation, the phase detector 118 detects a phase shift differential between the PD clock 110 and the DFI clock 112, and provides a control signal 124 based on this comparison. The phase interpolator 122 adjusts the phase of the PD clock 110 based on the control signal 124 in a manner that limits the phase shift differential between the PD clock 110 and DFI clock 112.

More particularly, in the illustrated embodiment of FIG. 1, the control signal 124 is a single-bit control signal which is provided to the FSM 120 and which is updated at regular time intervals to reflect the present phase relationship between the PD clock 110 and DFI clock 112. Thus, over a number of consecutive time intervals, the single-bit control signal 124 can establish a multi-bit pattern that represents the phase relationship between PD clock 110 and DFI clock 112 over time. The FSM 120 evaluates this multi-bit pattern and provides an N-bit control signal 126 to the phase interpolator 122 to induce a phase shift in the PD clock 110 to help align the phases of the PD and DFI clocks 110, 112.

Figure 2:
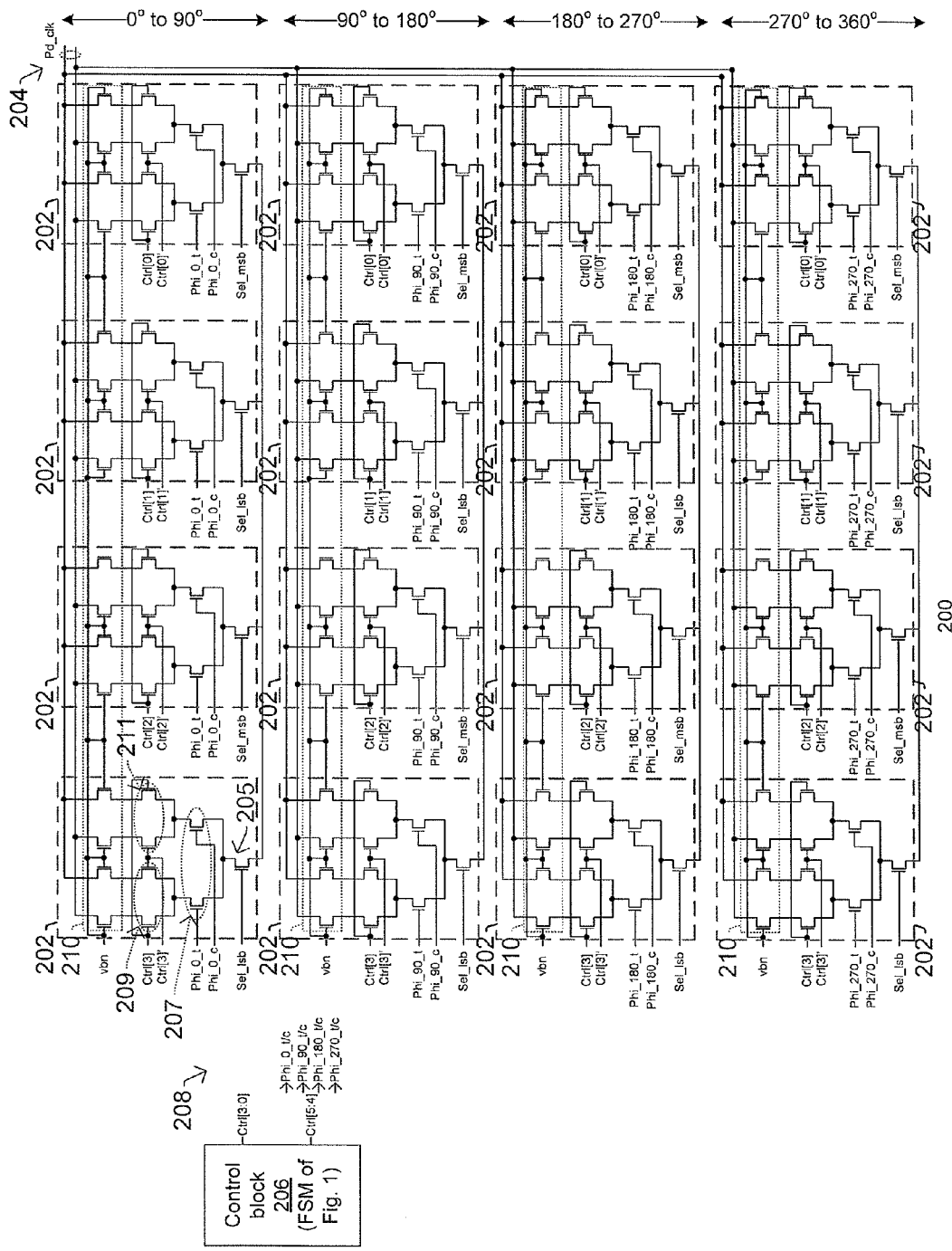
FIG. 2 shows a phase regulator in accordance with some embodiments.

FIG. 2 shows a more detailed embodiment of a phase interpolator 200 in accordance with some embodiments. The phase interpolator 200 includes an array of Gilbert cells 202 that output individual current levels, and a summation node 204 at which the current levels from Gilbert cells are summed. Each Gilbert cell 202 includes a tail current element 205 and a first differential amplifier pair 207 made up of first and second transistors to receive a first differential signal. The first and second transistors each have a terminal coupled to the tail current element. Second and third differential amplifiers 209, 211 receive a second differential signal. The second differential amplifier 209 is made up of third and fourth transistors each having a terminal coupled to the first transistor. The third differential amplifier 211 is made up of fifth and sixth transistors each having a terminal coupled to the second transistor. A current control element 210 arranged between the second and third differential amplifiers 209, 211 and the summation node 204.

To control the currents level from the Gilbert cells 202, a control block 206, such as the finite state machine of FIG. 1, provides phase interpolation control signals 208 to the Gilbert cells 202. The phase interpolation control signals are collectively indicative of a phase difference between a first clock (e.g., PD clock 110) and a second clock (e.g., DFI clock 112) to be phase locked. The phase interpolation control signals 208 define different phase step sizes by which the first clock is to be phase shifted to limit the phase difference. For example, the first and second clocks can be phase shifted relative to one another by up to a full period or 360°. If six total bits make up the phase interpolation control signal 208, two of the control bits can define which quadrant of phase shift is desired (e.g., 90°, 180°, 270°, or 360°) and the remaining four bits can sub-divide each 90° quadrant into 2^4 smaller increments (i.e., 16 smaller increments). Thus, each unique bit-pattern or increment is spaced apart from neighboring increments by 90°/16=5.625-degrees in such an example. Accordingly, if a phase shift of 157.5° is desired to align first and second clocks, the phase interpolation control signals can be set to have a collective bit-pattern of 01_1100, wherein the leading b'01 specifies a coarse phase shift step size of 90° and the trailing b'1100 (i.e., a value of twelve in decimal) specifies a fine phase shift step size of 12×5.625=67.5°, such that the total phase shift step size of 90° plus 67.5° gives the desired 157.5° phase shift step size. Hence, these phase interpolation control signals will tend to align the first and second clocks.

In the illustrated example of FIG. 2, the upper most control bits (i.e., ctrl[5:4] output by control block 206) have been mapped or decoded to into four different coarse tuning signals (Phi_0_t/c, Phi_90_t/c, Phi_180_t/c, and Phi_270_t/c). These coarse tuning signals are used to enable current and corresponding phase delay on a row-by-row basis for the array of Gilbert cells. The fine tuning signals (i.e., ctrl[3:0] output by control block 206) enable current and corresponding phase delay on a column-by-column basis. Thus, only when both a column and row at which a Gilbert cell is positioned are enabled does current flow from that Gilbert cell. For example, for the uppermost row, Phi_0_t/c signals induce a coarse phase shift step size of between 0° and 90°, while ctrl[3:0] can set the precise phase shift step size to sixteen different phase shift step sizes between 0° and 90° (e.g., 0°, 5.625°, 11.25°, . . . , 84.375°). Thus, Phi_0_t/c potentially enables each Gilbert cell in the first row, but the first row's Gilbert cells only contribute current to output node if their corresponding control signals are enabled. For example, the left-most Gilbert cell in the first row can provide current to summation node 204 if ctrl[3] is enabled, but will not provide current to summation node 204 if ctrl[3] is disabled. For the second row, Phi_90_t/c signals induce a coarse phase shift step size of between 90°-180°, while ctrl[3:0] can set the precise phase shift step size to sixteen different phase shift step sizes between 90° and 180° (e.g., 90°, 95.625°, . . . 174.375°). For the third row, phase shift step sizes can be between 180° and 270° (e.g., 180°, 185.625°, . . . , 264.375°); and for the fourth row phase shift step sizes can be between 270° and 360° (e.g., 270°, 275.625°, . . . , 354.375°).

To further facilitate accurate phase tuning, the Gilbert cells of FIG. 2 each include a current control element 210 to adjust the current level from the corresponding Gilbert cells. Notably, the current levels from the Gilberts cells are adjusted by different amounts for the different phase step sizes. This is achieved by setting the voltage (Vbn) supplied to the control terminal of the current control elements to different voltage levels (Vbn1, Vb2, Vbn3, Vbn4) depending on the step size specified by the phase control signals.

Figure 3:
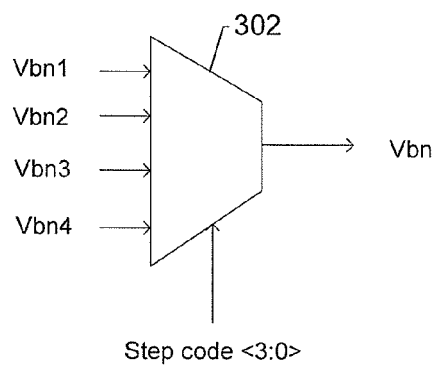
FIG. 3 shows a chart illustrating one manner in which a voltage bias can be varied based on step size for a phase regulator, and thereby adjust current provided from a Gilbert cell of the phase regulator.
Figure 3:
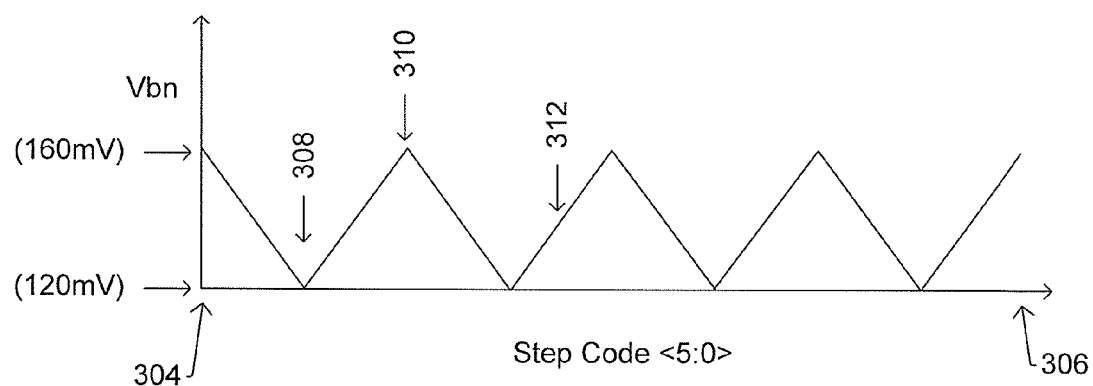

FIG. 3 shows a more detailed example of one manner of how the voltage Vbn can be adjusted to different voltage levels for different step sizes. As shown, a selection element 302 can select different voltage levels for Vbn based on the step code provided, and then provide the selected Vbn voltage to the current control elements (e.g., 210 in FIG. 2). The bottom portion of FIG. 3, which shows a chart, illustrates a 6-bit step code on the x-axis, and Vbn voltage levels on the y-axis. The x-axis corresponds to 2^6 unique step codes (i.e., 64 unique step codes) which are spread over 360° of phase offset between a left-most point 304 and a right-most point 306, and the y-axis can vary between 120 mv and 160 mv, for example.

The step codes can facilitate a phase delay for a first clock to "tune" the phase of the first clock (e.g., PD clock 110 in FIG. 1) to that of a second clock (e.g., DFI clock 112 in FIG. 1). If, for example, the first and second clocks are separated by a phase offset of 45°, the phase interpolation control signals (e.g., 208 in FIG. 2) could be set to a step code 000111 (see 308 in FIG. 3), which sets Vbn to 120 mV in an effort to align the phases of the first and second clocks. In contrast, if the first and second clocks are separated by a phase offset of 90°, the control signals could be set to 001111 (see 310 in FIG. 3), which sets Vbn to 160 mV to attempt to align the phases of the first and second clocks. Similarly, for a phase offset of 157.5°, the control signals could be set to 11011 (see 312 in FIG. 3), which sets Vbn to 140 mV. Thus, not only are the phase interpolation control signals (or step codes) set depending on the detected phase difference between the first and second clock signals, but the voltage Vbn is also set based on the step code used. Changing Vbn for different step codes improves the linearity of the phase interpolator.

Figure 4:
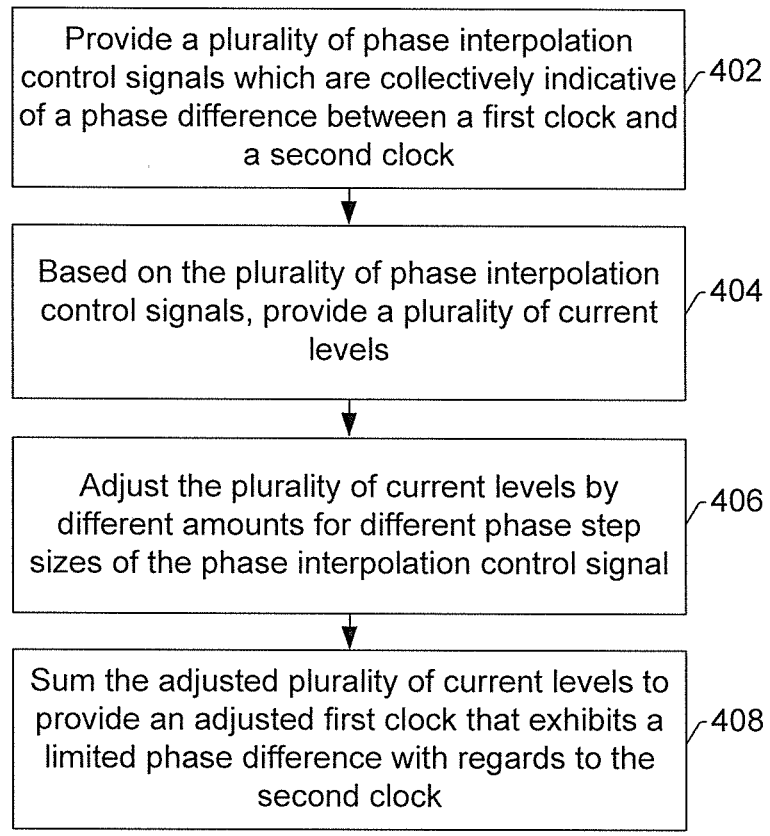
FIG. 4 shows a flow chart illustrating a method in accordance with some embodiments.

FIG. 4 shows a methodology in accordance with some embodiments. Although this method 400, as well as others included in this disclosure, may be illustrated or described as a series of acts or events, it will be appreciated that the illustrated ordering of such acts or events are not to be interpreted in a limiting sense. For example, although the illustrated acts or events may occur one after another in time according to the acts or events illustrated in the figures in some instances, in other instances some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

In 402, the method provides a plurality of phase interpolation control signals which are collectively indicative of a phase difference between a first clock and a second clock. The phase interpolation control signals define different phase step sizes by which the first clock is to be phase shifted to limit the phase difference.

In 404, based on the plurality of phase interpolation control signals, a plurality of current levels are provided.

In 406, the plurality of current levels are adjusted by different amounts for the different phase step sizes.

In 408, the adjusted plurality of current levels are summed to provide an adjusted first clock that exhibits a limited phase difference with regards to the second clock.

Thus, it will be appreciated that some embodiments relate to a phase interpolator. The phase interpolator includes a control block to provide a plurality of phase interpolation control signals which are collectively indicative of a phase difference between a first clock and a second clock. The phase interpolation control signals define different phase step sizes by which the first clock is to be phase shifted to limit the phase difference. A plurality of Gilbert cells provide a plurality of current levels, respectively, based on the plurality of phase interpolation control signals. A plurality of current control elements adjust the plurality of current levels from the plurality of Gilbert cells. The plurality of current levels are adjusted by different amounts for the different phase step sizes.

Another embodiment relates to a system for phase regulation of a clock signal between a memory controller and a plurality of memory elements. A memory controller is clocked according to a memory controller clock and which provides a DFI clock based on the memory controller clock. A first memory element that is clocked according to the DFI clock. A second memory element that is clocked according to a phase delayed (PD) clock, wherein the second memory element is downstream of the first memory element and latches data previously stored in the first memory element. A phase detection element to provide a phase interpolation control signal indicating a phase shift differential between the PD clock and the DFI clock. A phase interpolator to adjust the PD clock based on the phase interpolation control signal to limit the phase differential between the memory clock and the DFI clock.

Still another embodiment relates to a method. In this method, a plurality of phase interpolation control signals, which are collectively indicative of a phase difference between a first clock and a second clock, are provided. The phase interpolation control signals define different phase step sizes by which the first clock is to be phase shifted to limit the phase difference. Based on the plurality of phase interpolation control signals, a plurality of current levels are provided. The plurality of current levels are adjusted by different amounts for the different phase step sizes. The adjusted plurality of current levels are summed to provide an adjusted first clock that exhibits a limited phase difference with regards to the second clock.

It is to be understood that in the description of embodiments contained herein any direct connection or coupling between functional blocks, devices, components, circuit elements or other physical or functional units shown in the drawings or described herein could also be implemented by an indirect connection or coupling, i.e., a connection or coupling comprising one or more intervening elements. Furthermore, it should be appreciated that functional blocks or units shown in the drawings may be implemented as separate circuits in some embodiments, but may also be fully or partially implemented in a common circuit or common integrated circuit in other embodiments, or in some cases may also be implemented jointly by programming a processor accordingly. Also, it will be appreciated that terms such as "first", "second" and the like, are merely generic identifiers and do not imply any temporal relationship or structural arrangement of the elements. Thus, a first element does not necessary occur earlier in time than a second element, nor it is necessarily closer to (or further from) some locus than a second element.

It should be noted that the drawings are provided to give an illustration of some aspects and features of embodiments of the present invention and are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative location of the various components and elements shown. The features of the various embodiments described herein may be combined with each other. On the other hand, describing an embodiment with a plurality of features is not to be construed as indicating that all those features are necessary for practicing the present invention, as other embodiments may comprise less features and/or alternative features.

What is claimed is:

1. A phase interpolator, comprising:
   a control block to provide a plurality of phase interpolation control signals which are collectively indicative of a phase difference between a first clock and a second clock, wherein the phase interpolation control signals define different phase step sizes over a 360-degree phase interval by which the first clock is to be phase shifted to limit the phase difference;
   a plurality of current cells which provide a plurality of current levels, respectively, based on the plurality of phase interpolation control signals; and
   a plurality of current control elements having respective control gates to adjust the plurality of current levels from the plurality of current cells, wherein the plurality of current levels are adjusted by different amounts for the different phase step sizes;
   a selection element to provide a periodic voltage function, which repeats multiple times over the 360-degree phase interval, to the respective control gates of the current control elements based on the phase interpolation control signals.

2. The phase interpolator of claim 1, further comprising:
   a summation node to sum the plurality of adjusted current levels from the plurality of current cells to phase shift the first clock by a phase step size at a given time to limit the phase difference.

3. A phase interpolator, comprising:
   a control block to provide a plurality of phase interpolation control signals which are collectively indicative of a phase difference between a first clock and a second clock, wherein the phase interpolation control signals define different phase step sizes by which the first clock is to be phase shifted to limit the phase difference;
   a plurality of Gilbert cells which provide a plurality of current levels, respectively, based on the plurality of phase interpolation control signals; and
   a plurality of current control elements to adjust the plurality of current levels from the plurality of Gilbert cells, wherein the plurality of current levels are adjusted by different amounts for the different phase step sizes;
wherein a Gilbert cell of the plurality of Gilbert cells comprises:
   a tail current element;
   a first differential amplifier pair made up of first and second transistors to receive a first differential signal, where the first and second transistors each have a terminal coupled to the tail current element; and
   second and third differential amplifiers to receive a second differential signal, the second differential amplifier made up of third and fourth transistors each having a terminal coupled to the first transistor, and the third differential amplifier made up of fifth and sixth transistors each having a terminal coupled to the second transistor.

4. The phase interpolator of claim 3, further comprising:
   a summation node to sum the plurality of adjusted current levels from the plurality of Gilbert cells to phase shift the first clock by a phase step size at a given time to limit the phase difference.

5. The phase interpolator of claim 4, wherein the Gilbert cell further comprises:
   a current control element arranged between the second differential amplifier and the summation node.

6. The phase interpolator of claim 5, wherein the current control element includes a transistor whose gate terminal receives a time-varying voltage to regulate current provided from the Gilbert cell to the summation node.

7. The phase interpolator of claim 6, wherein the time-varying voltage is adjusted to different voltage levels for different phase step sizes.

8. A method, comprising:
providing a plurality of phase interpolation control signals which are collectively indicative of a phase difference between a first clock and a second clock, wherein the phase interpolation control signals define different phase step sizes over a 360-degree phase interval by which the first clock is to be phase shifted to limit the phase difference;
providing a plurality of current levels based on the plurality of phase interpolation control signals;
adjusting the plurality of current levels by different amounts for the different phase step sizes according to a periodic voltage function which repeats multiple times over the 360-degree phase interval; and
summing the adjusted plurality of current levels to provide an adjusted first clock that exhibits a limited phase difference with regards to the second clock.

9. The method of claim 8, wherein the plurality of current levels is adjusted by a current control element within a Gilbert cell.

10. The method of claim 9, wherein the current control element includes a transistor whose gate terminal receives a time-varying voltage to regulate current provided from the Gilbert cell to a summation node.

11. The method of claim 10, wherein the time-varying voltage is adjusted to different voltage levels for different values of a phase interpolation control signal.

12. The method of claim 11, wherein the different values of the phase interpolation control signal correspond to different phase step sizes for the phase interpolator.

13. A phase interpolator, comprising:
a control block to provide a plurality of coarse phase interpolation digital control signals and a plurality of fine phase interpolation digital control signals, wherein the coarse and fine phase interpolation digital control signals collectively define different phase step sizes by which a first clock is to be phase shifted relative to a second clock to limit a phase difference between the first and second clocks;
a plurality of Gilbert cells which are arranged in a series of rows and columns and which have their respective outputs coupled to a clock terminal on which a third clock is provided based on the first and second clocks, wherein the plurality of Gilbert cells provide a plurality of current levels, respectively, to the clock terminal based on the plurality of coarse and fine phase interpolation digital control signals; and
a plurality of current control transistors arranged between the clock terminal and respective outputs of the plurality of Gilbert cells, respectively, wherein respective gate terminals of the current control transistors receive a gate voltage whose voltage level is set based on the phase difference.

14. The phase interpolator of claim 13, wherein Gilbert cells along the same row receive the same coarse phase interpolation digital control signals as one another and wherein Gilbert cells along different rows receive different coarse phase interpolation digital control signals from one another.

15. The phase interpolator of claim 14, wherein Gilbert cells along the same column receive the same fine phase interpolation digital control signals as one another and wherein Gilbert cells along different columns receive different fine phase interpolation digital control signals from one another.

16. The phase interpolator of claim 13, wherein a Gilbert cell of the plurality of Gilbert cells comprises:
a tail current element;
a first differential amplifier pair made up of first and second transistors to receive a first differential signal, where the first and second transistors each have a first source/drain terminal coupled to the tail current element; and
second and third differential amplifiers to receive a second differential signal, the second differential amplifier made up of third and fourth transistors each having a source/drain terminal coupled to a second source/drain terminal of the first transistor of the first differential amplifier pair, and the third differential amplifier made up of fifth and sixth transistors each having a source/drain terminal coupled to a second source/drain terminal of the second transistor of the first differential amplifier pair.

17. The phase interpolator of claim 16, wherein a current control transistor has a source/drain region coupled to the second differential amplifier and a second source/drain region coupled to the clock terminal.

18. The phase interpolator of claim 13, wherein the plurality of coarse phase interpolation digital control signals and the plurality of fine phase interpolation digital control signals are collectively an N-bit value, and wherein neighboring phase step sizes are separated by 360°/2^N.

19. The phase interpolator of claim 13, wherein the gate voltage is adjusted in time to different voltage levels for different values of the coarse and fine phase interpolation digital control signals.

20. The phase interpolator of claim 19, wherein the different values of the coarse and fine phase interpolation digital control signals correspond to different phase step sizes for the phase interpolator.

\* \* \* \* \*